(12) United States Patent
Daun-Lindberg et al.

(10) Patent No.: US 6,542,023 B1
(45) Date of Patent: Apr. 1, 2003

(54) AC TRANSFER SWITCH USING SEMICONDUCTOR DEVICES

(75) Inventors: Timothy Charles Daun-Lindberg, Rochester, MN (US); Charles J. Pentek, Rochester, MN (US); Steven William Steele, Rochester, MN (US); Jon Anton Veer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/974,252

(22) Filed: Oct. 10, 2001

(51) Int. Cl.$^7$ .............................................. H03K 17/725
(52) U.S. Cl. ........................ 327/460; 327/453; 327/470; 307/85
(58) Field of Search ................................ 327/453, 460, 327/461, 470; 307/83, 84, 85

(56) References Cited

U.S. PATENT DOCUMENTS

| | | | | |
|---|---|---|---|---|
| 3,243,605 A | * | 3/1966 | Smith et al. | ................. 327/460 |
| 3,308,340 A | * | 3/1967 | Gille et al. | ................. 315/194 |
| 3,348,063 A | * | 10/1967 | Bray | ......................... 327/460 |
| 3,601,674 A | * | 8/1971 | Joslyn et al. | ............... 323/237 |
| 3,601,685 A | * | 8/1971 | Kuhn | ......................... 327/191 |
| 3,678,354 A | * | 7/1972 | Kitanosono et al. | ........ 318/294 |
| 4,197,992 A | * | 4/1980 | Klebanoff | ................. 236/46 R |
| 4,335,321 A | * | 6/1982 | Lyons et al. | ................ 250/551 |
| 4,747,061 A | | 5/1988 | Lagree et al. | |
| 4,761,563 A | | 8/1988 | Ross et al. | |
| 4,791,545 A | * | 12/1988 | Hinckley | .................... 323/235 |
| 5,182,464 A | | 1/1993 | Woodworth et al. | |
| 5,566,339 A | | 10/1996 | Perholtz et al. | |
| 5,892,299 A | | 4/1999 | Siewert et al. | |
| 6,046,917 A | * | 4/2000 | Gibbs et al. | .................. 363/52 |
| 6,317,346 B1 | * | 11/2001 | Early | .......................... 363/65 |

* cited by examiner

Primary Examiner—Terry D. Cunningham

(57) ABSTRACT

An AC transfer switch (ATS) is provided for switching a system load between at least two AC lines. A first bridge rectifier is connected to a first AC line for providing a first full wave rectified AC waveform. A first pair of oppositely poled silicon controlled rectifiers (SCRs) is coupled to the first bridge rectifier and to the system load. A second bridge rectifier is connected to a second AC line for providing a second full wave rectified AC waveform. A second pair of oppositely poled silicon controlled rectifiers (SCRs) coupled to the second bridge rectifier and to the system load. Control logic is coupled to a gate input of the first pair of oppositely poled silicon controlled rectifiers (SCRs) and a gate input of the second pair of oppositely poled silicon controlled rectifiers (SCRs) for applying one of the first full wave rectified AC waveform or the second full wave rectified AC waveform to the system load. The control logic includes a first AC line sense circuit for sensing the first AC line input and a second AC line sense circuit for sensing the second AC line input. A first optical isolator is responsive to an output signal provided by the first AC line sense circuit sensing the first AC line input within a predefined AC line tolerance for activating the gate input of the first pair of oppositely poled silicon controlled rectifiers (SCRs) and applying the first full wave rectified AC waveform to the system load. A second optical isolator is responsive to an output signal provided by the first AC line sense circuit sensing the first AC line input outside the predefined AC line tolerance and an output signal provided by the second AC line sense circuit sensing the second AC line input within the predefined AC line tolerance for activating the gate input of the second pair of oppositely poled silicon controlled rectifiers (SCRs) and applying the second full wave rectified AC waveform to the system load.

19 Claims, 2 Drawing Sheets

AC TRANSFER SWITCH USING SEMICONDUCTOR DEVICES

FIELD OF THE INVENTION

The present invention relates generally to the data processing field, and more particularly, relates to an AC transfer switch utilizing semiconductor devices to switch between two or more AC lines.

DESCRIPTION OF THE RELATED ART

Applications requiring an AC transfer switch are increasing. Information technology customers are required to run 24 hours a day, 7 days a week for 365 days a year. In order to achieve this kind of up time, many information technology customers are requiring their equipment to be plugged into two separate AC main grids. When a first AC line goes down, the information technology equipment will run off a second AC line. The two separate power grids are distributed throughout the customer's facility.

Information technology equipment must be able to reliably, quickly and safely switch between a bad AC line to a good AC line without affecting equipment operation.

An AC transfer switch (ATS) is used to switch between the different AC lines. Conventional ATS designs typically use electromechanical relay devices to switch between two or more AC lines. Electromechanical relay devices are much slower and much less reliable than semiconductor devices. Previous architectures using semiconductor devices have not been able to meet safety agency approvals.

A need exists for an AC transfer switch (ATS) capable of reliably, quickly and safely switching between AC lines. It is desirable to provide an AC transfer switch (ATS) utilizing semiconductor components capable of reliably, quickly and safely switching between two or more AC lines.

SUMMARY OF THE INVENTION

A principal object of the present invention is to provide an AC transfer switch (ATS) utilizing semiconductor components. Other important objects of the present invention are to provide such an AC transfer switch (ATS) utilizing semiconductor components substantially without negative effect and that overcome many of the disadvantages of prior art arrangements.

In brief, an AC transfer switch (ATS) for switching a system load between at least two AC lines is provided. A first bridge rectifier is connected to a first AC line for providing a first full wave rectified AC waveform. A first pair of oppositely poled silicon controlled rectifiers (SCRs) is coupled to the first bridge rectifier and to the system load. A second bridge rectifier is connected to a second AC line for providing a second full wave rectified AC waveform. A second pair of oppositely poled silicon controlled rectifiers (SCRs) coupled to the second bridge rectifier and to the system load. Control logic is coupled to a gate input of the first pair of oppositely poled silicon controlled rectifiers (SCRs) and a gate input of the second pair of oppositely poled silicon controlled rectifiers (SCRs) for applying one of the first full wave rectified AC waveform or the second full wave rectified AC waveform to the system load.

In accordance with features of the invention, the control logic includes a first AC line sense circuit for sensing the first AC line input and a second AC line sense circuit for sensing the second AC line input. A first optical isolator is responsive to an output signal provided by the first AC line sense circuit sensing the first AC line input within a predefined AC line tolerance for activating the gate input of the first pair of oppositely poled silicon controlled rectifiers (SCRs) and applying the first full wave rectified AC waveform to the system load. A second optical isolator is responsive to an output signal provided by the first AC line sense circuit sensing the first AC line input outside the predefined AC line tolerance and an output signal provided by the second AC line sense circuit sensing the second AC line input within the predefined AC line tolerance for activating the gate input of the second pair of oppositely poled silicon controlled rectifiers (SCRs) and applying the second full wave rectified AC waveform to the system load.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
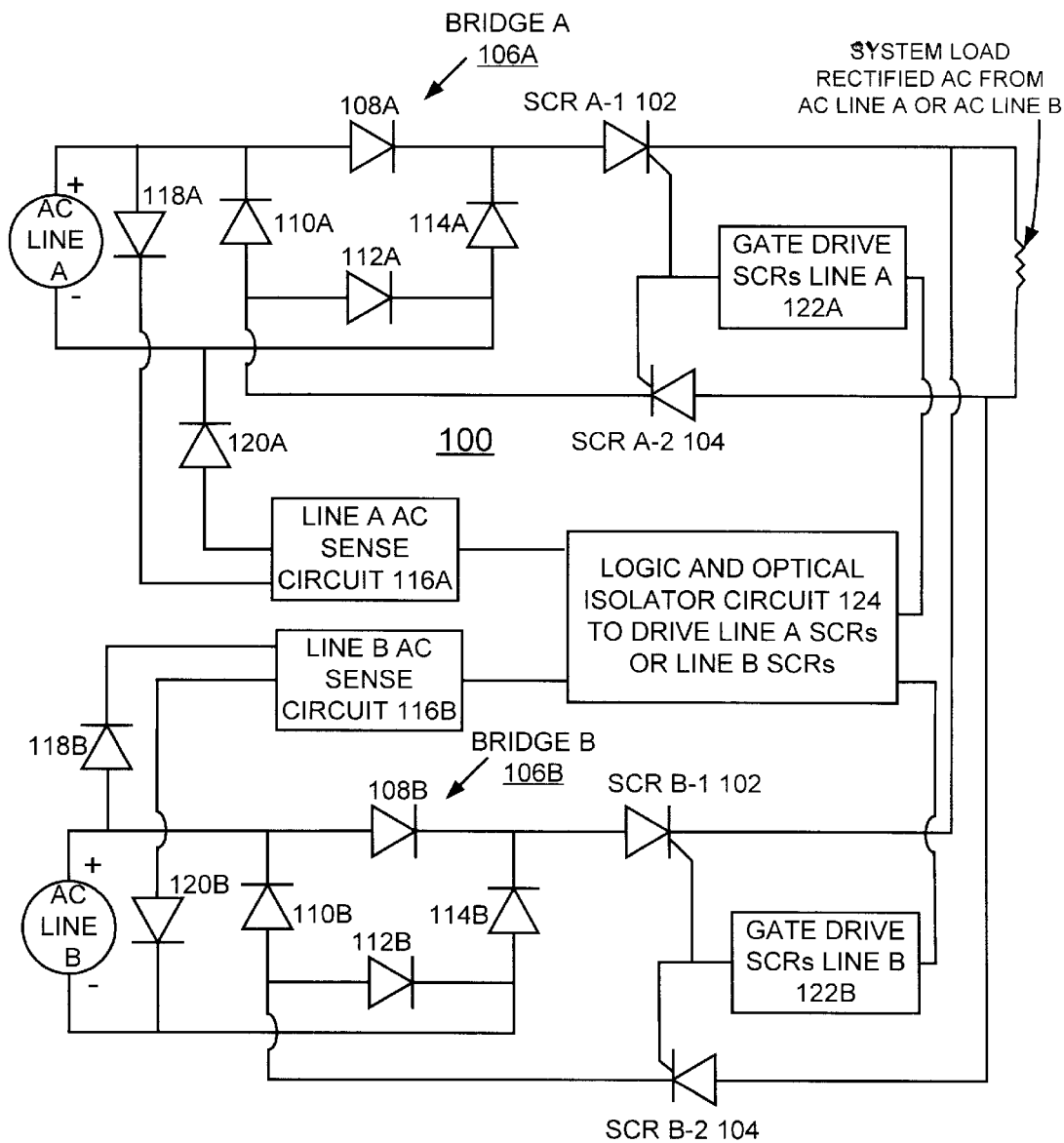
FIG. 1 is a schematic diagram illustrating an AC transfer switch (ATS) in accordance with the preferred embodiment.

Having reference now to the drawings, in FIG. 1 there is illustrated an AC transfer switch (ATS) generally designated by the reference character 100 and arranged in accordance with the preferred embodiment. AC transfer switch 100 is used to switch a system load between a first AC line A and a second AC line B. AC transfer switch 100 includes a first pair of oppositely poled silicon controlled rectifiers (SCRs), a first SCR A-1 102 and a second SCR A-2 104 connected to a bridge rectifier (BRIDGE A) 106A connected to the first AC line A. AC transfer switch 100 includes a second pair of oppositely poled silicon controlled rectifiers (SCRs), a first SCR B-1 102 and a second SCR B-2 104 connected to a bridge rectifier (BRIDGE B) 106B that is connected to the second AC line B. Bridge rectifier BRIDGE A 106A includes four diodes 108A, 110A, 112A and 114A connected for full wave rectification of the input of AC line A. Bridge rectifier BRIDGE B 106B includes four diodes 108B, 110B, 112B and 114B connected for full wave. rectification of the input of AC line B.

In accordance with features of the preferred embodiment, double insulated safety protection is provided between the AC mains generated hazardous voltage and an unplugged line cord of the AC transfer switch 100. In order to meet safety agency requirements, AC transfer switch 100 cannot present a safety hazard if a person physically touches the terminals of one of the AC transfer switch unplugged input AC line input, such as AC line A, while another input AC, such as AC line B, is connected to the potentially hazardous AC line. Double insulated safety protection must be provided between the AC line A and AC line B generated hazardous voltage and an unconnected AC line input, such as an unplugged line cord of the AC transfer switch. In other conventional ATS designs, electromechanical relays provide this protection by physically separating the AC input of one AC line A from the other AC line B. In the semiconductor AC transfer switch 100 of the preferred embodiment, relays are not required since the input AC lines A and B are separated from each other through SCR and bridge rectifier semiconductor devices, SCRs SCR A-1 102, SCR A-2 104; SCR B-1 104, SCR B-2 102 and bridge rectifier BRIDGE A 106A, BRIDGE B 106B.

The safety isolation of the series combination of an SCR and bridge rectifier described by the preferred embodiment has been used to achieve safety isolation in a 192V DC battery back-up between an unplugged AC line cord and the hazardous voltage created by a 192V battery string. The DC battery back-up using this isolation has UL, CSA and European safety agency approvals. If the AC transfer switch 100 is running off of AC line A and the line cord receptacle for AC line B is physically unplugged, two semiconductor devices, SCRs 102, 104 and bridge rectifier 106A, 106B, must fail in order for hazardous voltage or energy to become available on AC line cord receptacle B. This double fault protection of the AC transfer switch 100 meets safety agency requirements.

Advantages of using semiconductor devices of the AC transfer switch 100 over electromechanical relays are speed, reliability and cost. According to reliability engineering analysis, electromechanical relays have an intrinsic failure rate that is at least 3.1 times greater than that of semiconductor devices even for the worst semiconductor suppliers. Speed of a relay device is dependent on its size. The larger the relay, the slower its switching transition. In order to meet IBM power line disturbance requirements a relay must be able to switch within 10 milliseconds. Lab experience shows the largest relay to switch this fast is rated at 5 amperes. In order to build an AC transfer switch rated at more than 5 amperes, the use of parallel relays is required. Wiring relays in parallel requires more cost and more space. Parallel relays will not always switch at the same time. The first relay to switch will be operating above its rating for a short amount of time contributing to an early life failure. While a semiconductor device's speed is also dependent on its size, a very large semiconductor rated at 30 amperes can achieve switching transitions in the order of microseconds.

Referring to FIG. 1, in the AC transfer switch 100, AC line A is fed through the bridge rectifier (BRIDGE A) 106A where the AC line voltage is rectified into a full wave rectified AC waveform. The rectified waveform of the bridge rectifier (BRIDGE A) 106A is applied to the anode of silicon-controlled-rectifier (SCR) A-1 102 and the cathode of SCR A-2 104. The input AC line A is sensed by line A AC sense circuit 116A via a first pair of diodes 118A, 120A connected to AC line A before the bridge rectifier (BRIDGE A) 106A. At the same time AC line B similarly is fed through a bridge rectifier (BRIDGE B) 106B where the AC line voltage is rectified into a full wave rectified AC waveform. The rectified waveform of the bridge rectifier (BRIDGE B) 106B is applied to the anode of silicon-controlled-rectifier (SCR) B-1 102 and the cathode of SCR B-2 104. The input AC line B similarly is sensed by a line B AC sense circuit 116B via a second pair of diodes 118B, 120B connected to AC line B before the bridge rectifier (BRIDGE B) 106B. A respective one of a pair of gate drives 122A, 122B is connected to the SCRs A-1 102, A-2 104 of line A and the SCRs B-1 102, B-2 104 of line B. The outputs of line A AC sense circuit 116A and line B AC sense circuit 116B are applied to logic and optical isolator circuit 124 providing control inputs to the pair of gate drives 122A, 122B to drive line A SCRs A-1 102, A-2 104 or line B SCRs B-1 102, B-2 104.

In operation of AC transfer switch 100 initially if AC line A is sensed to be within a specified AC line tolerance by line A AC sense circuit 116A, the logic and optical isolator circuit 124 drives SCR A-1 102 and SCR A-2, 104 on via gate drive of SCRs line A 122A while keeping SCR B-1 102 and SCR B-2 104 off via gate drive of SCRs line B 122B. Once SCR A-1 102 and SCR A-2 104 are on, the rectified AC voltage of line A is available to the system load.

If AC line A is sensed to be outside a specified AC line tolerance by line A AC sense circuit 116A, and AC line B is sensed to be within the specified AC line tolerance by line B AC sense circuit 116B, the logic and optical isolator circuit 124 drives SCR B-1 102 and SCR B-2 104 on via gate drive of SCRs line B 122B, while keeping SCR A-1 102 and SCR A-2 104 off via gate drive of SCRs line A 122A. Once SCR B-1 102 and SCR B-2 104 are on, the rectified AC voltage of line B will be available to the system load.

In operation of AC transfer switch 100, AC line A is the default AC line whenever AC line A is within the specified AC line tolerance. If AC line A is not within the specified AC line tolerance and AC line B is within the specified AC line tolerance, the AC transfer switch 100 will supply AC line B to the load. If the AC transfer switch 100 is supplying AC line B to the load and AC line A falls within the specified tolerance, AC transfer switch 100 will switch to AC line A once AC line A has been determined to be stable. A switch of the AC lines will not occur unless AC line A falls out of tolerance. In the case where both AC lines come up at the same time, the logic defaults to AC line A. The transition from AC line A to AC line B is less than 5 milliseconds or a time depending on the speed of the AC sensing circuits.

Unlike conventional relay driven ATS designs that provide full wave AC to the system plugged into them, the semiconductor AC transfer switch 100 provides full-wave rectified AC to the connected system load. Most IT equipment can run off of full-wave rectified AC. Almost 100% of IT equipment power supplies are designed such that they will run off of full-wave rectified AC. A load of an AC motor or a 50/60 Hz transformer would not be directly connected to the semiconductor AC transfer switch 100, since these devices require full wave AC voltage.

Figure 2:
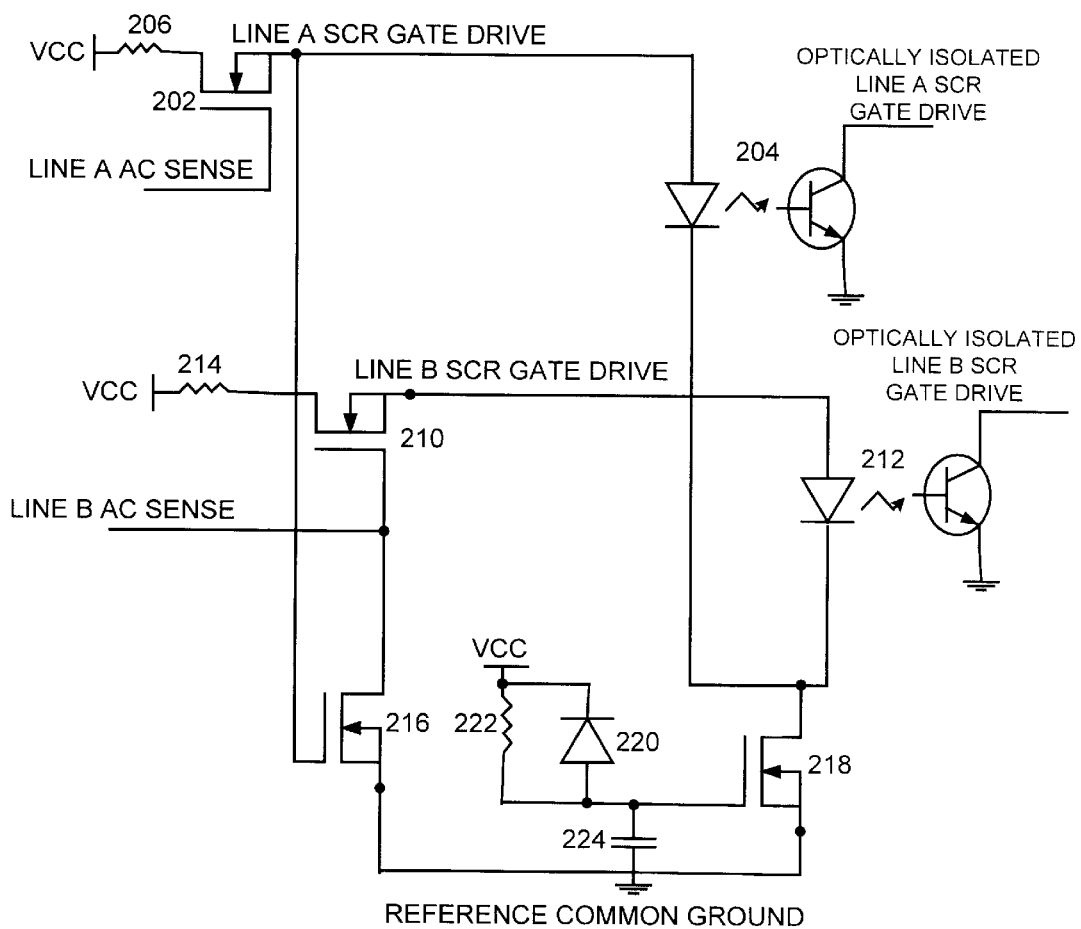
FIG. 2 is a schematic diagram illustrating an exemplary logic and optical isolator circuit to drive line A or line B silicon controlled rectifiers (SCRs) of the AC transfer switch (ATS) of FIG. 1 in accordance with the preferred embodiment.

Referring to FIG. 2, there is shown exemplary logic and optical isolator circuit 124 to drive line A or line B silicon controlled rectifiers (SCRs) 102, 104 of the AC transfer switch 100. Logic and optical isolator circuit 124 includes a first N-channel field effect transistor (NFET) 202 having a gate input from the line A AC sense circuit 116A. NFET 202 is coupled between a DC voltage supply rail VCC and a first optical isolator 204 with a first resistor 206 connected between NFET 202 and the DC voltage supply rail VCC. Logic and optical isolator circuit 124 includes a second N-channel field effect transistor (NFET) 210 having a gate input from the line B AC sense circuit 116B. NFET 210 is coupled between the DC voltage supply rail VCC and a second optical isolator 212 via a resistor 214. A third NFET 216 connected between the gate of FET 210 and ground has a gate input coupled to the drain of FET 202. A fourth NFET 218 connected between the connection of cathodes of optical isolators 204 and 212 and ground. A parallel connected diode 220 and a resistor 222 connected to the DC voltage supply rail VCC is connected in series with a capacitor 224 that is connected to ground. The gate of NFET 218 is connected to bias voltage provided by diode 220, resistor 222 and capacitor 224. The circuit of NFET 218, diode 220, resistor 222 and capacitor 224 is used to keep the optical isolators 204 and 212 off when the DC voltage supply rail VCC is not within tolerance.

When NFET 202 is activated via the gate input from Line A AC sense circuit 116A, the first optical isolator 204 provides an optically isolated line A SCR gate drive for SCR A-1 102, SCR A-2, 104. NFET 216 is turned on when NFET 202 is activated keeping NFET 210 off and keeping the second optical isolator 212 off and SCR B-1 102 and SCR B-2 104 off. If AC line A is sensed to be outside a specified AC line tolerance by line A AC sense circuit 116A and AC line B is sensed to be within the specified AC line tolerance by line B AC sense circuit 116B, then NFET 202 is turned off, keeping the first optical isolator 204 off, and SCR A-1 102, SCR A-2, 104 off. Then NFET 216 is turned off and NFET 210 is turned on via the gate input from Line B AC sense circuit 116B, the second optical isolator 212 provides an optically isolated line B SCR gate drive for SCR B-1 102, SCR B-2, 104.

Although the preferred embodiment implements the semiconductor AC transfer switch 100 with AC line A being the default AC line, it should be understood that the semiconductor AC transfer switch 100 can be implemented so that AC line B is the default AC line or that the first AC line that is within the specified tolerance is the default AC line. The semiconductor AC transfer switch 100 of the preferred embodiment with AC line A being the default AC line is provided for customers using the AC transfer switch to balance loads across specified AC lines.

In brief summary, the semiconductor AC transfer switch 100 of the preferred embodiment provides a faster, less expensive and more reliable method of switching between AC voltage supply grids than conventional relay ATS designs.

While the present invention has been described with reference to the details of the embodiments of the invention shown in the drawing, these details are not intended to limit the scope of the invention as claimed in the appended claims.

What is claimed is:

1. An AC transfer switch for switching a system load between at least two AC lines comprising:
    a first bridge rectifier connected to a first AC line for providing a first full wave rectified AC waveform;
    a first pair of oppositely poled silicon controlled rectifiers (SCRs) coupled to said first bridge rectifier and to the system load;
    a second bridge rectifier connected to a second AC line for providing a second full wave rectified AC waveform;
    a second pair of oppositely poled silicon controlled rectifiers (SCRs) coupled to said second bridge rectifier and to the system load; and
    control logic coupled to a gate input of said first pair of oppositely poled silicon controlled rectifiers (SCRs) and a gate input of said second pair of oppositely poled silicon controlled rectifiers (SCRs) for applying one of said first full wave rectified AC waveform or said second full wave rectified AC waveform to the system load.

2. An AC transfer switch for switching a system load between at least two AC lines as recited in claim 1 wherein both said first bridge rectifier and said second bridge rectifier include a four diode full wave bridge rectifier.

3. An AC transfer switch for switching a system load between at least two AC lines as recited in claim 1 wherein said control logic coupled to a gate input of said first pair of oppositely poled silicon controlled rectifiers (SCRs) and a gate input of said second pair of oppositely poled silicon controlled rectifiers (SCRs) include a first AC line sense circuit for sensing the first AC line input and a second AC line sense circuit for sensing the second AC line input.

4. An AC transfer switch for switching a system load between at least two AC lines as recited in claim 3 includes a first optical isolator responsive to an output signal provided by said first AC line sense circuit sensing said first AC line input within a predefined AC line tolerance for activating said gate input of said first pair of oppositely poled silicon controlled rectifiers (SCRs) for applying said first full wave rectified AC waveform to the system load.

5. An AC transfer switch for switching a system load between at least two AC lines as recited in claim 4 includes a second optical isolator, said second optical isolator responsive to said first AC line sense circuit sensing said first AC line input outside said predefined AC line tolerance and said first optical isolator being deactivated; and said second optical isolator responsive to an output signal provided by said second AC line sense circuit sensing said second AC line input within said predefined AC line tolerance for activating said gate input of said second pair of oppositely poled silicon controlled rectifiers (SCRs) for applying said second full wave rectified AC waveform to the system load.

6. An AC transfer switch for switching a system load between at least two AC lines as recited in claim 5 includes a first field effect transistor coupled to said first optical isolator and having a gate input coupled to said output of said first AC line sense circuit.

7. An AC transfer switch for switching a system load between at least two AC lines as recited in claim 6 includes a second field effect transistor coupled to said second optical isolator and having a gate input coupled to said output of said second AC line sense circuit; and a third field effect transistor coupled to said gate input of said second field effect transistor and having a gate input coupled to said first field effect transistor.

8. An AC transfer switch for switching a system load between at least two AC lines as recited in claim 7 wherein said first field effect transistor is turned on by said gate input coupled to said output of said first AC line sense circuit for activating said first optical isolator, and said third field effect transistor turned on when said first field effect transistor is turned on keeping said second field effect transistor off and keeping said second optical isolator off and said second pair of oppositely poled silicon controlled rectifiers (SCRs) off.

9. An AC transfer switch for switching a system load between at least two AC lines as recited in claim 7 wherein said first field effect transistor is turned off by said gate input coupled to said output of said first AC line sense circuit sensing said first AC line input outside said predefined AC line tolerance for deactivating said first optical isolator, and said third field effect transistor turned off when said first field effect transistor is turned off, and said second field effect transistor is turned on by said gate input coupled to said output of said second AC line sense circuit sensing said second AC line input within said predefined AC line tolerance for activating said second optical isolator.

10. An AC transfer switch for switching a system load between at least two AC lines as recited in claim 9 wherein each of said first field effect transistor, said second field effect transistor, and said third field effect transistor includes an N-channel field effect transistor (NFET).

11. An AC transfer switch for switching a system load between at least two AC lines as recited in claim 1 wherein said first full wave rectified waveform of said first bridge rectifier is applied to an anode of a first SCR and a cathode of a second SCR of said first pair of oppositely poled silicon controlled rectifiers (SCRs), a cathode of said first SCR coupled to the system load and an anode of said second SCR coupled to the system load.

12. An AC transfer switch for switching a system load between at least two AC lines comprising:
- a first bridge rectifier connected to a first AC line for providing a first full wave rectified AC waveform;
- a first pair of oppositely poled silicon controlled rectifiers (SCRs) coupled to said first bridge rectifier and to the system load;
- a second bridge rectifier connected to a second AC line for providing a second full wave rectified AC waveform;
- a second pair of oppositely poled silicon controlled rectifiers (SCRs) coupled to said second bridge rectifier and to the system load; and
- a first optical isolator coupled to a gate input of said first pair of oppositely poled silicon controlled rectifiers (SCRs);
- a second optical isolator coupled to a gate input of said second pair of oppositely poled silicon controlled rectifiers (SCRs);
- a first AC line sense circuit for sensing the first AC line input;
- a second AC line sense circuit for sensing the second AC line input;
- control logic coupled to said first AC line sense circuit and said second AC line sense circuit; said control logic for activating said first optical isolator and applying said first full wave rectified AC waveform to the system load responsive to said first AC line sense circuit sensing said first AC line input within a predefined AC line tolerance; and said control logic for deactivating said first optical isolator responsive to said AC line sense circuit sensing said first AC line input outside a predefined AC line tolerance and for activating said second optical isolator and applying said second full wave rectified AC waveform to the system load responsive to said second AC line sense circuit sensing said second AC line input within a predefined AC line tolerance.

13. An AC transfer switch for switching a system load between at least two AC lines as recited in claim 12 wherein said first full wave rectified waveform of said first bridge rectifier is applied to an anode of a first SCR and a cathode of a second SCR of said first pair of oppositely poled silicon controlled rectifiers (SCRs), a cathode of said first SCR coupled to the system load and an anode of said second SCR coupled to the system load.

14. An AC transfer switch for switching a system load between at least two AC lines as recited in claim 12 wherein both said first bridge rectifier and said second bridge rectifier include a four diode full wave bridge rectifier.

15. An AC transfer switch for switching a system load between at least two AC lines as recited in claim 12 wherein said control logic includes a first N-channel field effect transistor (NFET) coupled to said first optical isolator device and having a gate input coupled to an output of said first AC line sense circuit.

16. An AC transfer switch for switching a system load between at least two AC lines as recited in claim 15 wherein said control logic includes a second N-channel field effect transistor (NFET) coupled to said second optical isolator device and having a gate input coupled to an output of said second AC line sense circuit.

17. An AC transfer switch for switching a system load between at least two AC lines as recited in claim 16 wherein said control logic includes a third N-channel field effect transistor (NFET) coupled to said gate input of said second NFET and having a gate input coupled to said first NFET.

18. An AC transfer switch for switching a system load between at least two AC lines as recited in claim 17 wherein said first NFET is turned on by said gate input coupled to said output of said first AC line sense circuit for activating said first optical isolator responsive to said first AC line sense circuit sensing said first AC line input within a predefined AC line tolerance, and said third NFET is turned on when said first NFET is turned on, keeping said second NFET off and keeping said second optical isolator off and said second pair of oppositely poled silicon controlled rectifiers (SCRs) off.

19. An AC transfer switch for switching a system load between at least two AC lines as recited in claim 17 wherein said first NFET is turned off by said gate input coupled to said output of said first AC line sense circuit for deactivating said first optical isolator responsive to said first AC line sense circuit sensing said first AC line input outside a predefined AC line tolerance, and said third NFET is turned off when said first NFET is turned off, said second NFET is turned on by said gate input coupled to said output of said second AC line sense circuit for activating said second optical isolator responsive to said second AC line sense circuit sensing said second AC line input within a predefined AC line tolerance.

* * * * *